US012315566B2

(12) United States Patent
Kawasumi

(10) Patent No.: US 12,315,566 B2
(45) Date of Patent: May 27, 2025

(54) INFORMATION PROCESSING DEVICE AND MEMORY SYSTEM

(71) Applicant: Kioxia Corporation, Tokyo (JP)

(72) Inventor: Atsushi Kawasumi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 160 days.

(21) Appl. No.: 18/184,368

(22) Filed: Mar. 15, 2023

(65) Prior Publication Data

US 2024/0071499 A1 Feb. 29, 2024

(30) Foreign Application Priority Data

Aug. 31, 2022 (JP) ................................ 2022-138790

(51) Int. Cl.
*G11C 16/04* (2006.01)
*G06F 7/544* (2006.01)

(52) U.S. Cl.
CPC ........ *G11C 16/0483* (2013.01); *G06F 7/5443* (2013.01)

(58) Field of Classification Search
CPC .......................... G11C 16/0483; G11C 16/048
USPC .................................................... 365/185.18
See application file for complete search history.

(56) References Cited

U.S. PATENT DOCUMENTS 5,740,326 A 4/1998 Boulet et al.
6,493,263 B1 12/2002 Shibata et al.
7,113,416 B2 9/2006 Koide et al.
11,257,547 B2 2/2022 Hsu et al.
11,270,764 B2 3/2022 Cong et al.
11,593,456 B1 * 2/2023 Singh ...................... H03M 1/38
2019/0147329 A1 * 5/2019 Hekmatshoartabari ...................... G06V 10/82 706/26
2021/0216094 A1 * 7/2021 Ankamreddi ............ G06F 1/30
2021/0295905 A1 9/2021 Lee et al.

FOREIGN PATENT DOCUMENTS

JP 3199707 B2 8/2001
JP 2005-209317 A 8/2005
JP 2021-527886 A 10/2021
JP 7014364 B2 2/2022

* cited by examiner

*Primary Examiner* — Muna A Techane
(74) *Attorney, Agent, or Firm* — Foley & Lardner LLP

(57) ABSTRACT

An information processing device includes a string including a first transistor and a second transistor, and a first wiring line connected to an end of the string. The first transistor has a threshold voltage corresponding to first data. The second transistor has a drain and a source, and a resistance value between the drain and the source corresponds to second data. A current corresponding to a product of the first data and the second data flows through the string.

20 Claims, 12 Drawing Sheets

| INNER PRODUCT (Q × K) | | Vth(K) H (0) | Vth(K) L (1) |
|---|---|---|---|
| Vcgr (Q) | L (0) | 0 | 0 |
| | H (1) | 0 | 1 |

| OVERDRIVE VOLTAGE (Vcgr − Vth) | | Vcgr(Scaled) | | | |
|---|---|---|---|---|---|
| | | 0 | 1 | 2 | 3 |
| Vth(Scaled) | 3 | -3 | -2 | -1 | 0 |
| | 2 | -2 | -1 | 0 | 1 |
| | 1 | -1 | 0 | 1 | 2 |
| | 0 | 0 | 1 | 2 | 3 |

FIG. 5A

| INNER PRODUCT (Q × K) | | Vcgr(Scaled) | | | |
|---|---|---|---|---|---|
| | | 0 | 1 | 2 | 3 |
| K | 0 | 0 | 0 | 0 | 0 |
| | 1 | 0 | 1 | 2 | 3 |
| | 2 | 0 | 2 | 4 | 6 |
| | 3 | 0 | 3 | 6 | 9 |

FIG. 5B

INFORMATION PROCESSING DEVICE AND MEMORY SYSTEM

CROSS REFERENCE TO RELATED APPLICATIONS

This application is based upon and claims the benefit of priority from the prior Japanese Patent Application No. 2022-138790, filed on Aug. 31, 2022, the entire contents of which are incorporated herein by reference.

FIELD

Embodiments of the present invention relate to an information processing device and a memory system.

BACKGROUND

In machine learning, it is necessary to perform information processing with a great number of multiply-accumulate operations. In a case where many weighting factors used in multiply-accumulate operations are stored in a semiconductor memory, for example, and read from the semiconductor memory by a CPU or the like, the CPU needs to access the semiconductor memory frequently. This prevents the multiply-accumulate operations from being performed at a high speed.

BRIEF DESCRIPTION OF THE DRAWINGS

FIG. 5A shows an example, in which the first data and the second data each have four values.

FIG. 5B shows a result of calculation of an inner product of 4-bit data corresponding to the first data K and 4-bit data corresponding to the second data.

DETAILED DESCRIPTION

In order to solve the aforementioned problem, an information processing device according to an embodiment of the present invention is provided, the information processing device including:

a string including a first transistor and a second transistor connected to the first transistor; and a first wiring line connected to an end of the string, the first transistor having a threshold voltage corresponding to first data, the second transistor having a drain and a source, a resistance value between the drain and the source corresponding to second data, wherein a current corresponding to a product of the first data and the second data flows through the string.

Embodiments of an information processing device and a memory system will be described below with reference to the accompanying drawings. Although main parts of the information processing device and the memory system will be mainly described below, the information processing device and the memory system may include an element or a function that is not illustrated or described. The following descriptions do not exclude any element or function that is not illustrated or described.

The information processing device and the memory system according to the embodiments have a characteristic in that information processing such as a multiply-accumulate operation is performed in a semiconductor memory. Although information processing such as a multiply-accumulate operation using a NAND flash memory will be mainly described in the following descriptions, semiconductor memories used in the information processing device and the memory system are not limited to NAND flash memories.

Figure 1A:
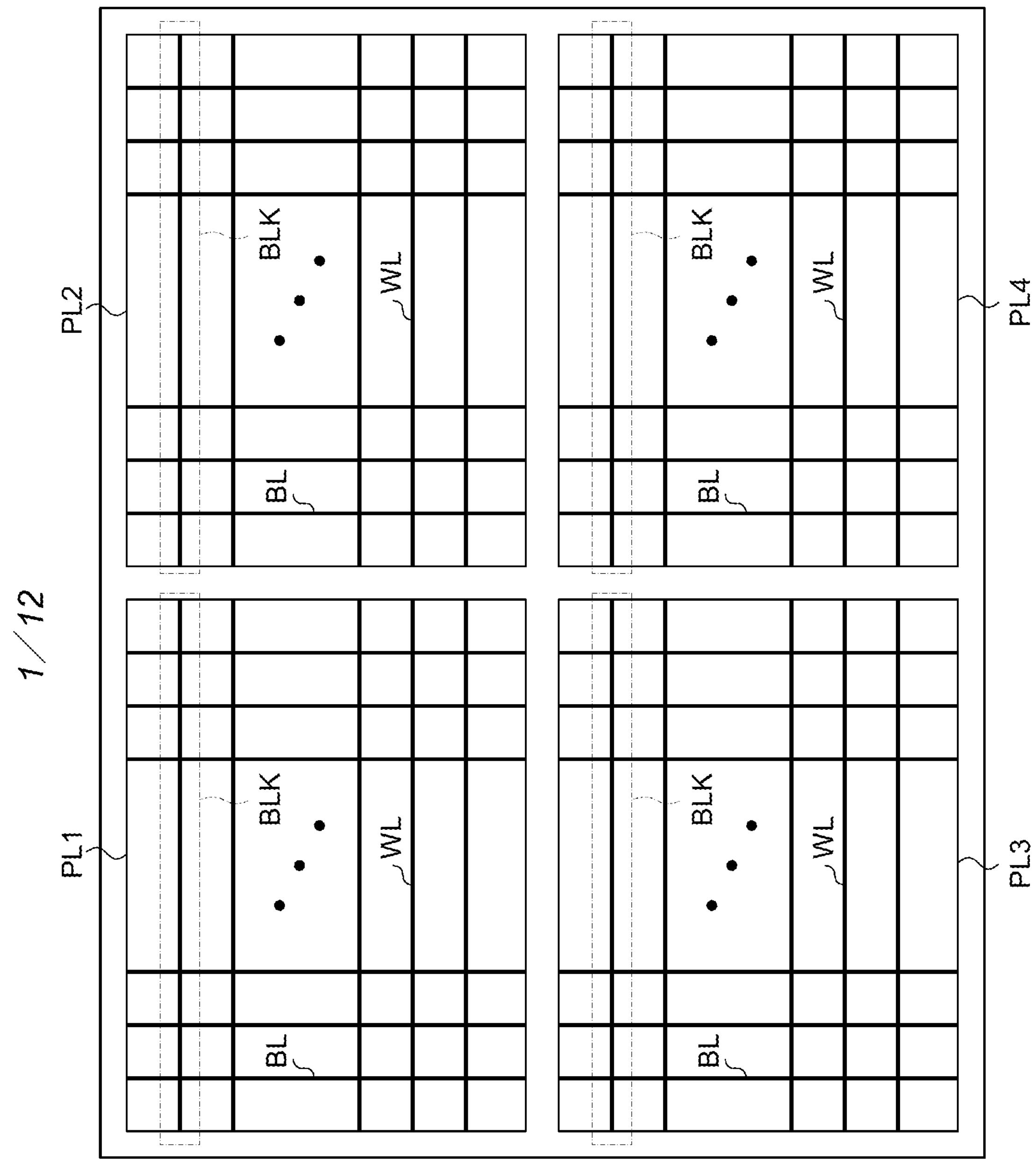
FIG. 1A illustrates a schematic configuration of an ordinary semiconductor memory.

FIG. 1A illustrates a schematic configuration of an ordinary semiconductor memory 1. The semiconductor memory 1 shown in FIG. 1A has a memory region with four planes PL1 to PL4 arranged two by two. Each of the planes PL1 to PL4 has a plurality of blocks BLK extending in a lateral direction. Data are written and read using a block BLK as a unit. Specifically, one of word lines WL is selected, and data are simultaneously written to or read from a plurality of memory cells connected to the selected word line WL via a plurality of bit lines BL.

Figure 1B:
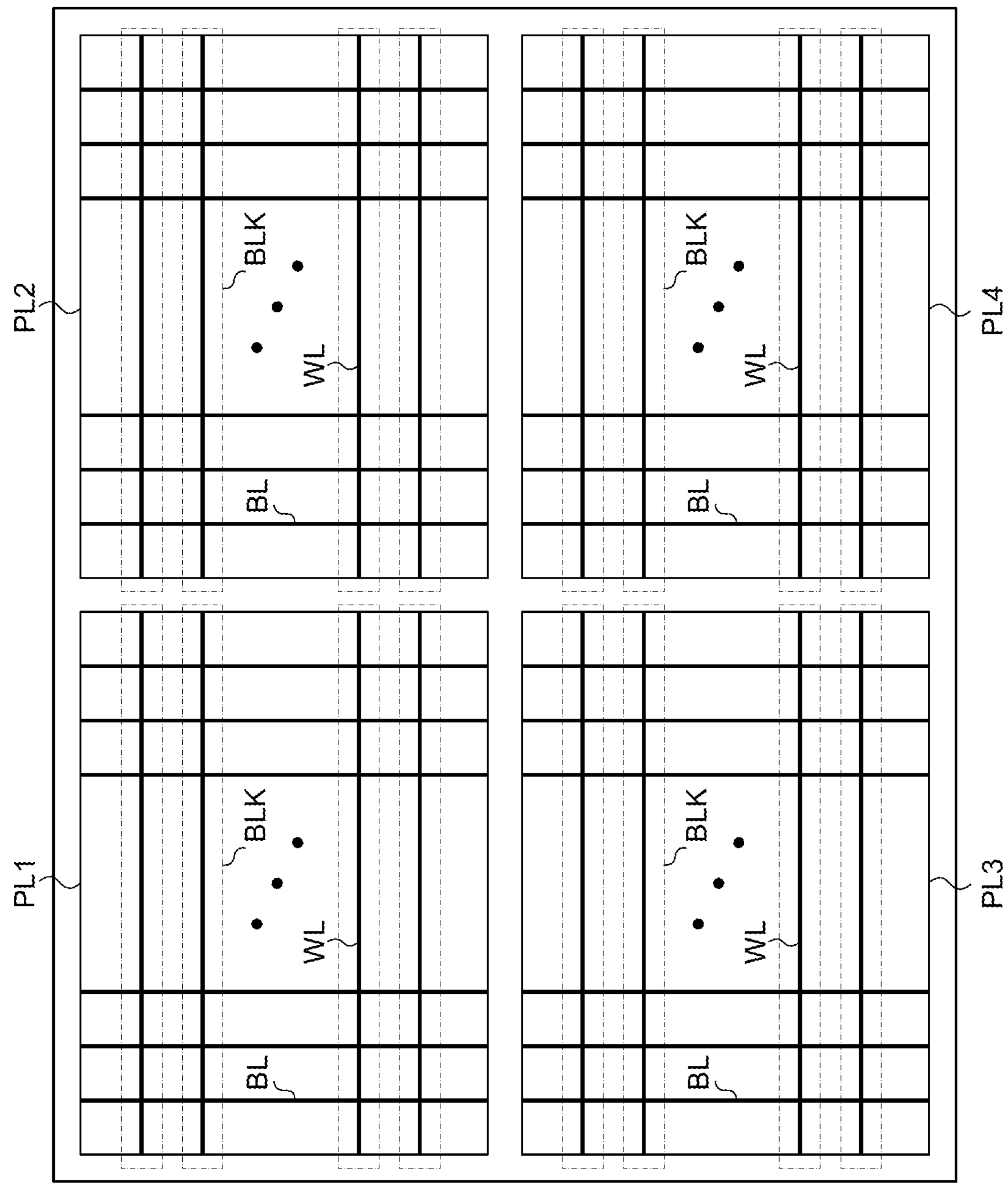
FIG. 1B illustrates a schematic configuration of a computer in memory (CIM).

FIG. 1B illustrates a schematic configuration of a computer in memory (CIM) 2. The CIM 2 shown in FIG. 1B has four planes PL1 to PL4 like the semiconductor memory 1 shown in FIG. 1A. In the CIM 2, two or more word lines WL are simultaneously selected. As a result, in a read operation, data are simultaneously read from a plurality of memory cells connected a single bit line BL, and a logical operation is performed on the bit line BL.

Thus, unlike ordinary semiconductor memories, two or more word lines WL are simultaneously selected the CIM 2 to perform a logical operation on a single bit line BL. Therefore, information processing including the logical operation may be performed faster than the case where data stored in a plurality of memory cells are read in multiple times and transferred to a CPU to perform a logical operation there.

Figure 2:
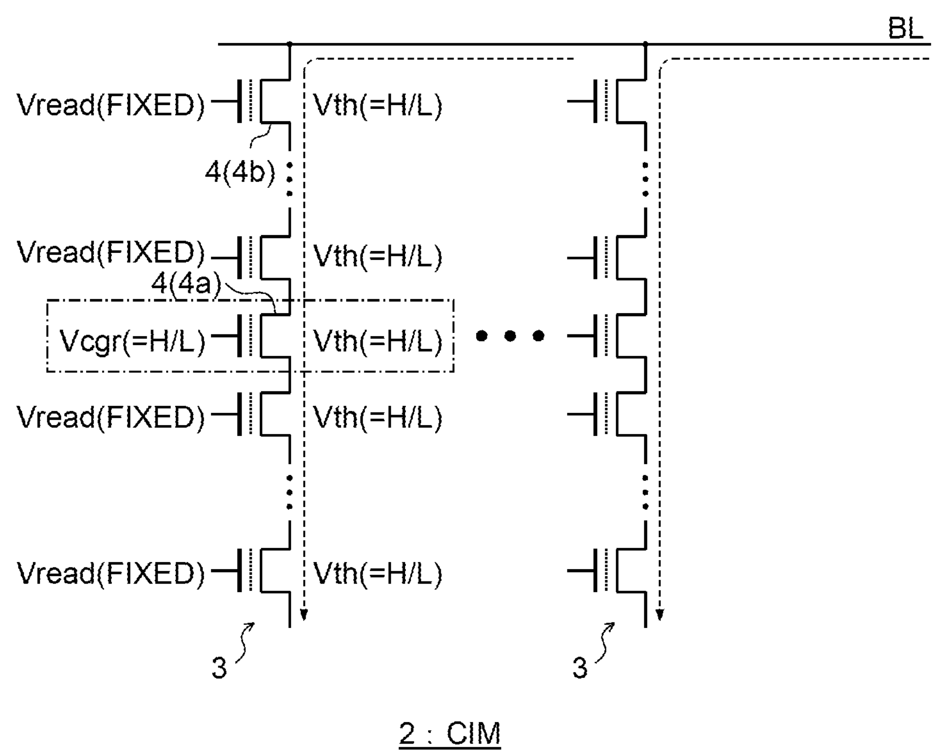
FIG. 2 is a circuit diagram illustrating a basic configuration of the CIM.

FIG. 2 is a circuit diagram showing a basic configuration of the CIM 2. The CIM 2 shown in FIG. 2 has a configuration similar to that of a NAND flash memory, for example. More specifically, in the CIM 2 shown in FIG. 2, a plurality of strings 3 are connected to one bit line BL. Each string 3 includes cascode-connected memory cell transistors 4. The "cascode-connected" herein also means that the memory cell transistors 4 may be connected in series. In the following descriptions, the memory cell transistors 4 may be simply called "transistors 4."

A threshold voltage corresponding to a value of first data K is set to each of the transistors 4 included in the string 3.

The first data K has two values, 0 and 1, for example. If the first data K is 1, the threshold voltage of the transistor 4 is set to be at a low value, and if the first data K is 0, the threshold voltage of the transistor 4 is set to be at a high value. Second data Q is inputted to the gate of each transistor 4 via word lines WL.

One of the transistors 4 (hereinafter referred to as "specific transistor 4*a*") included in each string 3 is used in the logical operation of the first data K and the second data Q, and the other transistors 4*b* are set to be in an ON state. Specifically, the transistors 4*b* are set to be in the ON state by supplying a voltage (hereinafter referred to as "voltage Vread") that is considerably higher than the threshold voltage of the transistor 4 to the gates of the transistors 4*b*. Since the voltage Vread is far higher than a maximum threshold voltage that may be set at the transistors 4*a* and 4*b*, regardless of the level of threshold voltage of the transistors 4*b*, the transistors 4*b* receiving the voltage Vread at their gates are brought into the ON state.

Figures 3, 4:
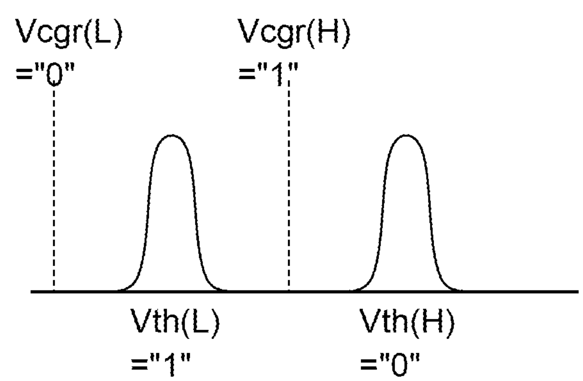
FIG. 3 illustrates a relationship between first data and second data, and a current flowing through a string.
FIG. 4 is a diagram for explaining a relationship between a threshold voltage and a gate voltage of a specific transistor.

FIG. 3 is a diagram showing a relationship between the first data K and the second data Q, and a current flowing through the string 3. In FIG. 3, the first data K and the second data Q is 0 or 1. If the first data K is 1, the threshold voltage of the specific transistor 4*a* is low, and if the first data K is 0, the threshold voltage of the specific transistor 4*a* is high. If the second data Q is 0, the gate voltage Vcgr of the specific transistor 4*a* is low, and if the second data Q is 1, the gate voltage Vcgr of the specific transistor 4*a* is high. In FIG. 3, the state in which a current flows through the string 3 is represented by 1, and the state in which no current flows through the string 3 is represented by 0.

As may be understood from FIG. 3, only when the first data K is 1(L) and the second data Q is 1(H), a current flows through the string 3.

FIG. 4 is a diagram for explaining the relationship between the threshold voltage and the gate voltage of the specific transistor 4*a*. When the gate voltage Vcgr is higher than the threshold voltage, a current flows through the specific transistor 4*a*, in other words the string 3. This means K=1. If the threshold voltage of the specific transistor 4*a* becomes higher, no current flows through the specific transistor 4*a*, in other words the string 3.

As shown in FIG. 3, the current flowing through the string 3 is equivalent to the result of an inner product calculation of 2-bit data corresponding to the first data K that is 0 or 1, and 2-bit data corresponding to the second data Q that is 0 or 1.

As shown in FIG. 2, two or more strings 3 are connected to a single bit line BL. Whether a current flows through each string 3 is determined by the logical operation of the first data K and the second data Q with respect to each string 3. As the number of strings 3 through which a current flows increases, the amount of current flowing through the bit line BL increases and the potential of the bit line BL decreases. The voltage level of the bit line BL thus reflects the results of the logical operations performed for the two or more strings 3.

FIGS. 2 to 4 show examples in which the first data K and the second data Q are binary data. Since recent NAND flash memories may store multi-value data in memory cells, the first data K and the second data Q may be multi-value data such as data having three or more values.

FIG. 5A shows that the first data K and the second data Q each have four values. Hereinafter, a voltage difference between the threshold voltage and the gate voltage in the specific transistor 4*a* in the string 3 is called "overdrive voltage." FIG. 5A shows the relationship among the first data K, the second data Q, and the overdrive voltage. In FIG. 5A, positive values indicate that the gate voltage of the specific transistor 4*a* is higher than the threshold voltage, and negative values indicate that the gate voltage is lower than the threshold voltage. As shown in FIG. 5A, the overdrive voltage may have seven values, namely 3, 2, 1, 0, −1, −2, and −3.

FIG. 5B is a diagram showing a result of calculation of inner product of 4-bit data corresponding to the first data K and 4-bit data corresponding to the second data. As shown in FIG. 5B, the inner product value may have seven values, namely 9, 6, 4, 3, 2, 1, and 0. The inner product value is proportional to the value of current flowing through the string 3.

As may be understood from FIGS. 5A and 5B, as the overdrive voltage increases, the inner product value increases. When the overdrive voltage has a negative value, the inner product value becomes zero regardless of the absolute value thereof. This means that when the overdrive voltage has a negative value, no current flows through the bit line, and the potential of the bit line does not decrease. Furthermore, the same overdrive voltage does not means the same inner product value.

Figure 6:
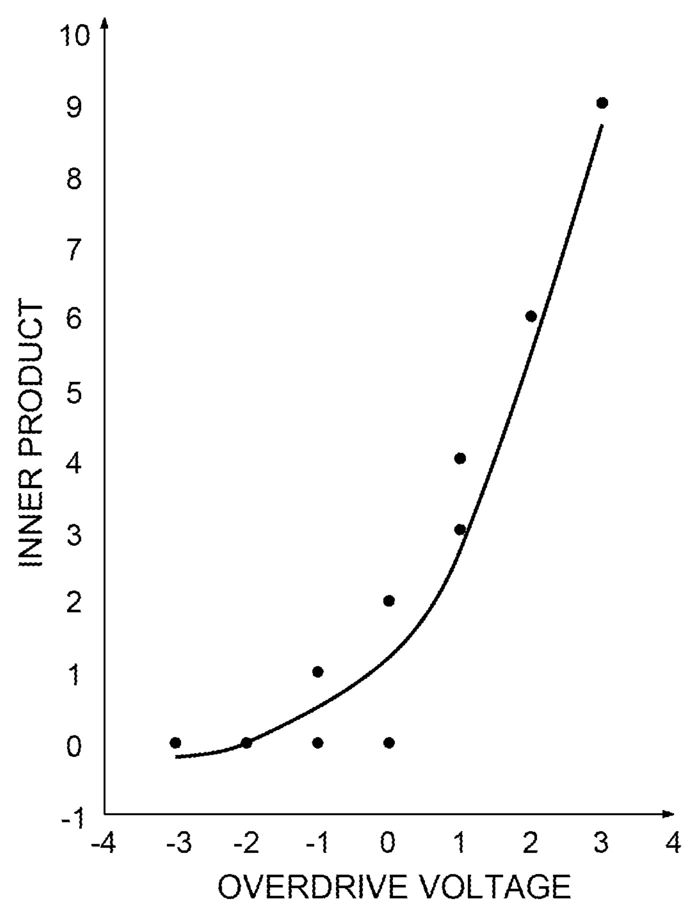
FIG. 6 is a diagram on which a relationship between overdrive voltage and inner product value is plotted.

FIG. 6 is a diagram on which the relationship between the overdrive voltage and the inner product value is plotted. As shown in FIG. 6, when the overdrive voltage is at the value of 1, the inner product may have two values other than zero. Therefore, it is impossible to generate a curve that passes all plots of inner product value except for the case when the inner product value is zero.

As may be understood from FIG. 6, in the CIM 2 having the configuration show in FIG. 2, there may be a case where the first data K and the second data Q cannot be determined from the current flowing through the bit line. Furthermore, as the threshold voltage and the gate voltage of the transistors 4*a* and 4*b* included in the string 3 fluctuate due to variations in manufactured products, for example, the current flowing through the string 3 may also fluctuate. The fluctuations in the current flowing through the string 3 may make it more difficult to determine the first data K and the second data Q from the current.

Thus, there is a problem in that in the string 3 having the configuration shown in FIG. 2, it is not possible to determine the first data K and the second data Q from the current flowing through the string 3. In contrast, in an information processing device 10 according to a first embodiment described below, the first data K and the second data Q may be determined from the current flowing through the string 3.

First Embodiment

Figure 7:
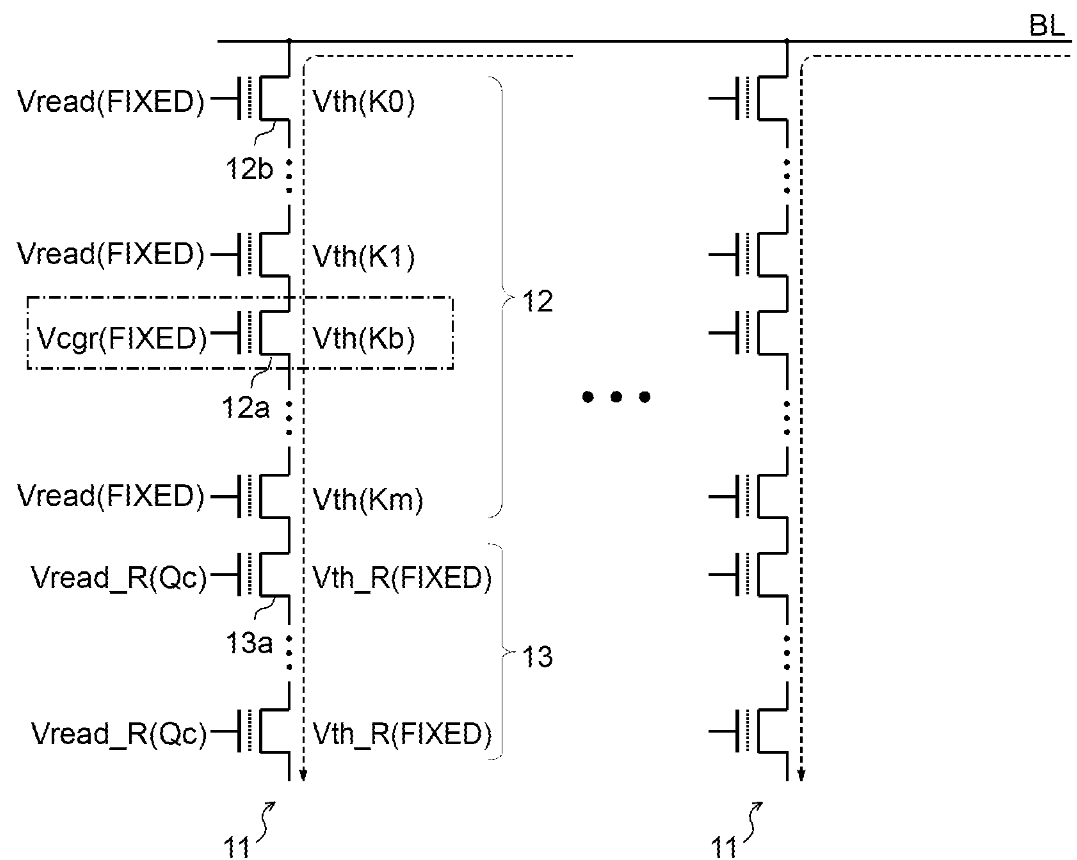
FIG. 7 is a circuit diagram of a main part of an information processing device according to a first embodiment.

FIG. 7 is a circuit diagram of a main part of the information processing device 10 according to the first embodiment. Like the configuration shown in FIG. 2, the configuration of the information processing device 10 according to the first embodiment has two or more strings 11 connected to a single bit line BL. However, the configuration of each string 11 in FIG. 7 differs from that of the string 3 in FIG. 2. In the information processing device 10 shown in FIG. 7, a current corresponding to the product of first data K and second data Q is caused to flow from the bit line BL to the string 11. The first data K and the second data Q2 may be binary data, or multi-value data having three or more values. The first data K may be called "key," and the second data Q may be called "query" herein.

As described above, multiple strings 11 are connected to a single bit line BL, and a current corresponding to the product of the first data K and the second data Q flows through each string 11. A current flowing through the bit line BL corresponds to the sum of the currents flowing through the multiple strings 11. As the current flowing from the bit line BL to each string 11 increases, the potential of the bit line BL decreases. Therefore, the first data K and the second data Q may be determined from the potential of the bit line BL.

The string 11 shown in FIG. 7 includes a plurality of cascode-connected memory cell transistors. In the following descriptions, each memory cell transistor may be simply called "transistor." The transistors included in the string 11 may be divided into a first transistor group 12 and a second transistor group 13. The first transistor group 12 is disposed to a side closer to the bit line BL and includes two or more transistors. The second transistor group 13 is disposed to a side more distant from the bit line BL than the first transistor group 12 and includes one or more transistors.

A threshold voltage is set to transistors 12*a* and 12*b* included in the first transistor group 12 according to a corresponding item of the first data K. A voltage is applied to the gate of each transistor 13*a* in the second transistor group 13 according to a corresponding item of the second data Q. The number of items of the first data K corresponds to the number of transistors 12*a* and 12*b* in the first transistor group 12. The number of items of the second data Q corresponds to the number of second transistors 13*a*, for example.

The gates of the transistors 12*a* and 12*b* in the first transistor group 12 and the gate of each transistor 13*a* in the second transistor group 13 of the string 11 are connected to different word lines WL. A first voltage Vcgr is applied to the gate of the transistors 12*a*, which is any one of the transistors in the first transistor group 12, via the corresponding word line WL. A voltage corresponding to an item of the second data Q is supplied to the gate of each transistor 13*a* in the second transistor group 13 via the corresponding word line WL.

A current flows through the string 11, the current corresponding to the product of the first data K corresponding to the threshold voltage of the transistor 12*a*, which is one of the transistors 12*a* and 12*b* in the first transistor group 12, and the second data Q corresponding to the voltage supplied to the gate of each transistor 13*a* in the second transistor group 13.

In more detail, the first voltage Vcgr is applied to the gate of the transistor 12*a*, which is any one of the transistors in the first transistor group 12, and a second voltage Vread that is higher than the first voltage Vcgr is applied to the gates of the transistors 12*b*, which are the remaining one or more transistors in the first transistor group 12. The first voltage Vcgr is higher than a maximum threshold voltage that may be set at the transistor 12*a*. The voltage difference between the first voltage Vcgr and the threshold voltage is the overdrive voltage. A current corresponding to the overdrive voltage flows between the drain and the source of the transistor 12*a*. More specifically, as the overdrive voltage increases, the current between the drain and the source of the transistor 12*a* increases.

The second voltage Vread is applied to the gates of all of the remaining one or more transistors 12*b* in the first transistor group 12 so that the remaining one or more transistors 12*b* operate in the ON state. The second voltage Vread is thus considerably higher than the first voltage Vcgr.

The same threshold voltage is set at each transistor 13*a* in the second transistor group 13 in the first embodiment. To the gate of each transistor 13*a* in the second transistor group 13, a voltage corresponding to an item of the second data Q is inputted. This makes the second transistor group 13 to have a resistance value corresponding to the inputted item of the second data Q.

More specifically, the first transistor group 12 of the string 11 shown in FIG. 7 includes cascode-connected m transistors 12*a* and 12*b*, where m is an integer of 2 or more. A threshold voltage associated with a corresponding item of the m items of the first data K is set to each of the m transistors 12*a* and 12*b*.

The first voltage Vcgr is applied to the gate of the transistor 12*a*, which is any one of the m transistors 12*a* and 12*b*, and the second voltage Vread is applied to the gate of each of the remaining one or more transistors 12*b*.

A current corresponding to the overdrive voltage flows through the m transistors 12*a* and 12*b* of the first transistor group 12, the overdrive voltage being the voltage difference between the threshold voltage of the transistor 12*a*, to the gate of which the first voltage Vcgr is applied, and the first voltage Vcgr. In the m transistors 12*a* and 12*b*, the transistor 12*a*, to the gate of which the first voltage Vcgr is applied, operates in a sub-threshold region, and the remaining one or more transistors 12*b*, to the gates of which the second voltage Vread is applied, operate in a saturation region.

The second transistor group 13 includes one or more transistors 13*a*, where n is an integer of 1 or more. The same threshold voltage, for example, is set to the transistors 13*a*. A voltage corresponding to an item of the n items of the second data Q is applied to the gate of each of the transistors 13*a*. Each of the transistors 13*a* has a resistance value corresponding to a voltage difference between the voltage corresponding to the item of the second data Q and the threshold voltage. The number of items of the second data Q does not need to be always the same as the number of transistors 13*a* in the second transistor group 13. Furthermore, the threshold voltage of the transistor 13*a* in the second transistor group 13 does not need to be always the same.

The item of the second data Q may be supplied to apply the corresponding voltage to the gate of each transistor 13*a* so that the drain-source resistance of each transistor 13*a* in the second transistor group 13 becomes a fixed value. The drain-source resistance may differ among the transistors 13*a* of the second transistor group 13.

If the number of transistors 13*a* in the second transistor group 13 is two or more, the transistors 13*a* are cascode-connected, and thus the source voltage of each transistor 13*a* differs. Therefore, in order to set the resistance value between the drain and the source of each transistor 13*a*, the source voltage of the transistor 13*a* needs to be taken into account. More specifically, if two or more transistors 13*a* are cascode-connected in the second transistor group 13, the source voltage a transistor 13*a* becomes higher as the location of the transistor 13*a* becomes closer to the first transistor group 12. Therefore, as the transistor 13*a* is located closer to the first transistor group 12, the voltage level of the voltage corresponding to the supplied item of the second data Q and applied to the gate of the transistor 13*a* needs to be increased.

The current I flowing through the string 11 may be expressed by the following equation (1):

$$I=a\times(Kb\times Qc) \quad (1)$$

In the equation (1), "a" denotes proportionality constant, Kb2 denotes first data for setting the threshold voltage of the transistor 12*a* of the first transistor group 12, to the gate which the first voltage Vcgr is applied, and Qc denotes second data for applying a voltage to the gate of each transistor 13*a* in the second transistor group 13.

Figure 8:
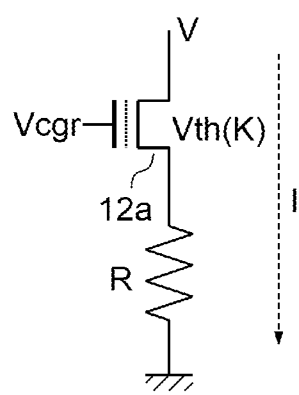
FIG. 8 is an equivalent circuit diagram of a string shown in FIG. 7.

FIG. 8 is an equivalent circuit diagram of the string 11 shown in FIG. 7. In FIG. 8, the first transistor group 12 is represented by a single transistor 12*a*, and the second transistor group 13 is represented by a single resistance R. The transistor 12*a* shown in FIG. 8 is the transistor 12*a* included in the transistors of the first transistor group 12, to the gate of which the first voltage Vcgr is applied. The remaining one or more transistors 12*b* in the first transistor group 12 are set to be in the ON state, and therefore may be considered to be omitted in a circuit operation.

The resistance R in FIG. 8 has a resistance value corresponding to the sum of the values of the source-drain resistance of the one or more transistors 13*a* in the second transistor group 13. Each transistor 13*a* in the second transistor group 13 has a drain-source resistance corresponding to the voltage difference between the voltage corresponding to the supplied item of the second data Q, which is applied to the gate, and the threshold voltage. Therefore, the total resistance value of the second transistor group 13 corresponds to the sum of the drain-source resistance values of the one or more transistors 13*a* in the second transistor group 13.

As described above, in the first embodiment, the transistor 12*a* of the first transistor group 12, to the gate of which the first voltage Vcgr is applied, operates in the sub-threshold region, and the one or more transistors 12*b*, to the gates of which the second voltage Vread is applied, operate in the saturation region. The sub-threshold region is also called "linear region," in which the drain-source current linearly changes relative to the gate voltage.

In the first embodiment, a current corresponding to the product of the first data K and the second data Q is caused to flow through the string 11 to change the potential of the bit line BL. As the threshold voltage and the gate voltage of each transistor included in the string 11 changes, the current flowing through the string 11 also changes, which may lead to a change in the bit line BL. The first embodiment is intended to curb changes in the current flowing through the string 11 in the calculation of the product of the first data K and the second data Q in the string 11.

Since the transistor shown in FIG. 8 operates in the sub-threshold region, the current I between the drain and the source of the transistor may be expressed by the following transistor model equation (2):

$$I = I_o 10^{\frac{V_{gs}-V_{th}}{S_g}+\frac{V_{ds}}{S_d}} + \left(1 - e^{-\frac{V_{ds}}{V_{th}}}\right) \tag{2}$$

In the equation (2), Vgs denotes gate-source voltage of the transistor, Vds denotes drain-source voltage of the transistor, and Vth denotes threshold voltage of the transistor. Sg denotes sub-threshold swing parameter, and Sd denotes drain induced barrier lowering parameter. Io denotes constant of proportionality determined by the gate length L, the gate width, and the mobility in each transistor in the string.

If a logarithm transformation is performed on the equation (2) with the second term of the right hand side being ignored and with the voltage drop caused by the current I at the resistance R shown in FIG. 8 being taken into account, the following equation (3) may be obtained.

$$\ln(I)+a\times I=b\times(Vg-Vth)+c \tag{3}$$

In the equation (3), Vg denotes gate potential of the transistor. The following equations (4), (5), and (6) indicate "a," "b," and "c" of the equation (3), respectively. In the equation (4), Rb denotes the value of the resistance R in FIG. 8. In the equation (6), V denotes the value of the drain voltage of the transistor 12*a* shown in FIG. 8.

$$a = \frac{R_b}{S_g} \times \ln 10 \tag{4}$$

$$b = \frac{\ln 10}{S_g} \tag{5}$$

$$c = \frac{V \cdot \ln 10}{S_d} + \ln I_o \tag{6}$$

Figure 9:
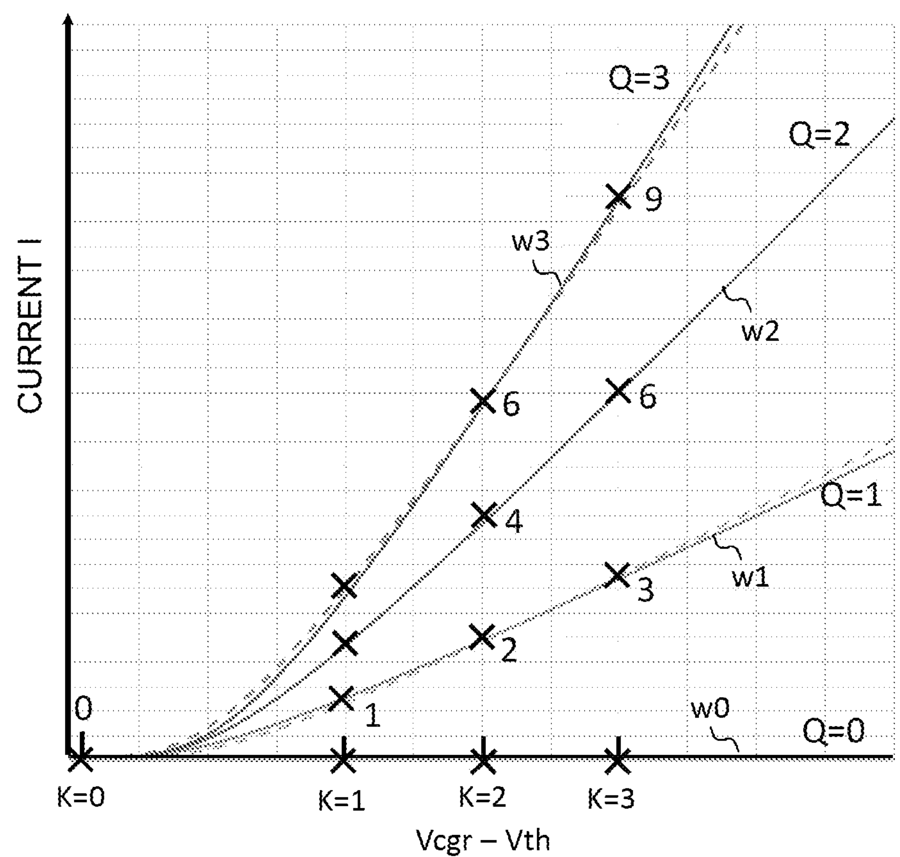
FIG. 9 is a diagram showing curves each representing a relationship between overdrive voltage and drain-source current of a transistor.

FIG. 9 is a diagram showing curves each expressing a relationship between overdrive voltage and drain-source current of a transistor. The horizontal axis of FIG. 9 indicates the overdrive voltage, and the vertical axis indicates the drain-source current of the transistor 12*a*. Solid curves in FIG. 9 are simulation waveforms calculated based on the equation (3). Broken curves are waveforms representing cases where a fluctuation in threshold voltage or gate voltage, for example, is caused in the transistors 12*a* and 12*b* in the string 11.

FIG. 9 shows lines w0 indicating the case where the second data Q relating to the voltage applied to the gate of the transistors in the second transistor group 13 is 0, curves w1 in the case where Q is 1, curves w2 in the case where Q is 2, and curves w3 in the case where Q is 3. As the second data Q changes, the resistance value in the second transistor group 13 changes, and the curves representing the relationship between the overdrive voltage and the drain-source current of the transistor 12*a* also changes.

The points X in FIG. 9 are plot positions each indicating the drain-source current of the transistor 12*a* when a specific overdrive voltage is given. As the threshold voltage and the gate voltage of each of the transistors 12*a*, 12*b*, and 13*a* included in the string 11 changes, the current flowing through the string 11 changes, and the waveforms of the curves w1 to w3 shown in FIG. 9 also change. In order to obtain a correct result of a multiply-accumulate operation by monitoring the potential of the bit line BL even if the waveforms of the curves w1 to w3 may change, it is desirable that plot positions of the overdrive voltage be set in a region in which the waveforms of the curves w1 to w3 are close to straight lines.

In the example of FIG. 9, all the plot positions of the overdrive voltage are in linear regions of the curves w1 to w3. Therefore, the intervals of the plot positions are substantially the same, and the overdrive voltage may be correctly determined from the current flowing through the string 11. This means that the first data K and the second data Q may be determined from the current flowing through the string 11.

The waveforms of the curves w1 to w3 in FIG. 9 may be changed by adjusting the resistance value of the second transistor group 13 in the string 11. In order to adjust the resistance value in the second transistor group 13, the threshold voltage of each transistor 13*a* in the second transistor group 13 may be adjusted, for example. As described above, the threshold voltage of each transistor 13*a* in the second transistor group 13 is set to be the same. Therefore, the waveforms of the curves w1 to w3 may be adjusted at a time by simultaneously changing the threshold voltage of each transistor 13*a*, and as a result, the linear region of each curve may be broadened.

The voltage level of the overdrive voltage may be changed by adjusting the voltage level of the first voltage Vcgr applied to the gate of the transistor 12*a* in the first transistor group 12. Therefore, the first voltage Vcgr may be adjusted so that the plot positions of the overdrive voltage may be within the linear regions of the curves w1 to w3.

Figure 10:
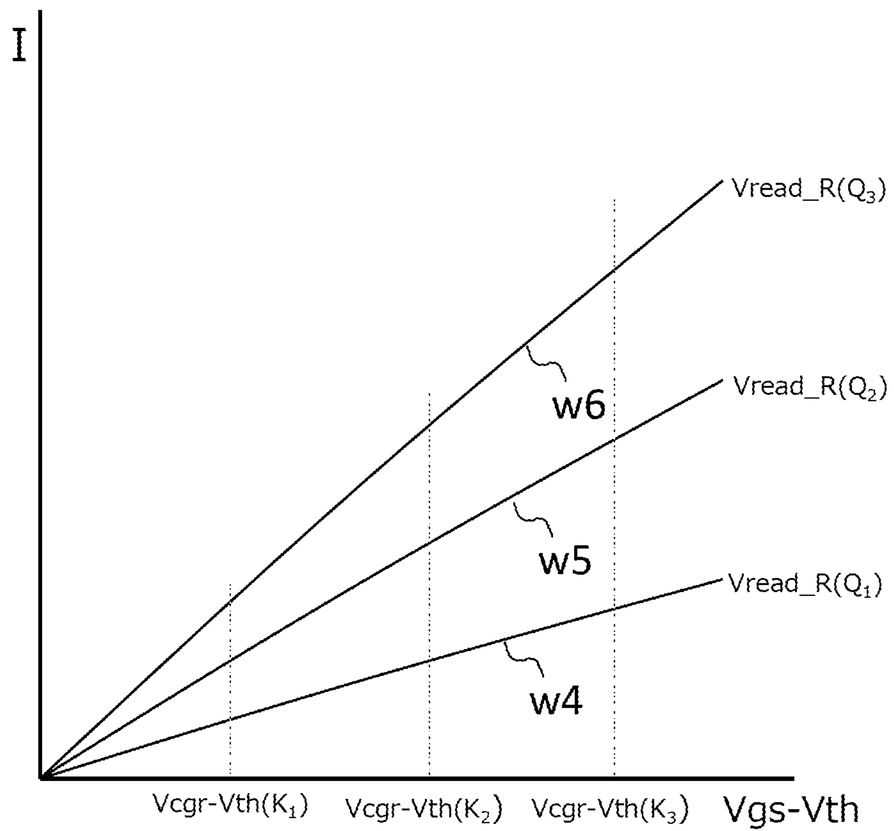
FIG. 10 is a diagram showing an ideal relationship between an overdrive voltage applied to the gate of a specific transistor and a current flowing through a string.

FIG. 10 is a diagram showing an ideal relationship between the overdrive voltage applied to the gate of a specific transistor 12*a* in the first transistor group 12 of the string 11 and the current flowing through the string 11. The horizontal axis of FIG. 10 indicates the overdrive voltage (Vcgr−Vth) applied to the gate of the transistor 12*a*, and the vertical axis indicates the current flowing through the string 11. FIG. 10 shows three straight lines w4 to w6 indicating cases where the voltage corresponding to the second data Q applied to the gates of the transistors 13*a* in the second transistor group 13 of the string 11 is changed in three ways.

As shown in FIG. 10, if the current flowing through the string 11 linearly changes relative to the change in overdrive voltage, the intervals between plot positions become constant. Therefore, even if the current flowing through the string 11 may fluctuate to some extent, corresponding items of the first data K and the second data Q may be determined.

Figure 11:
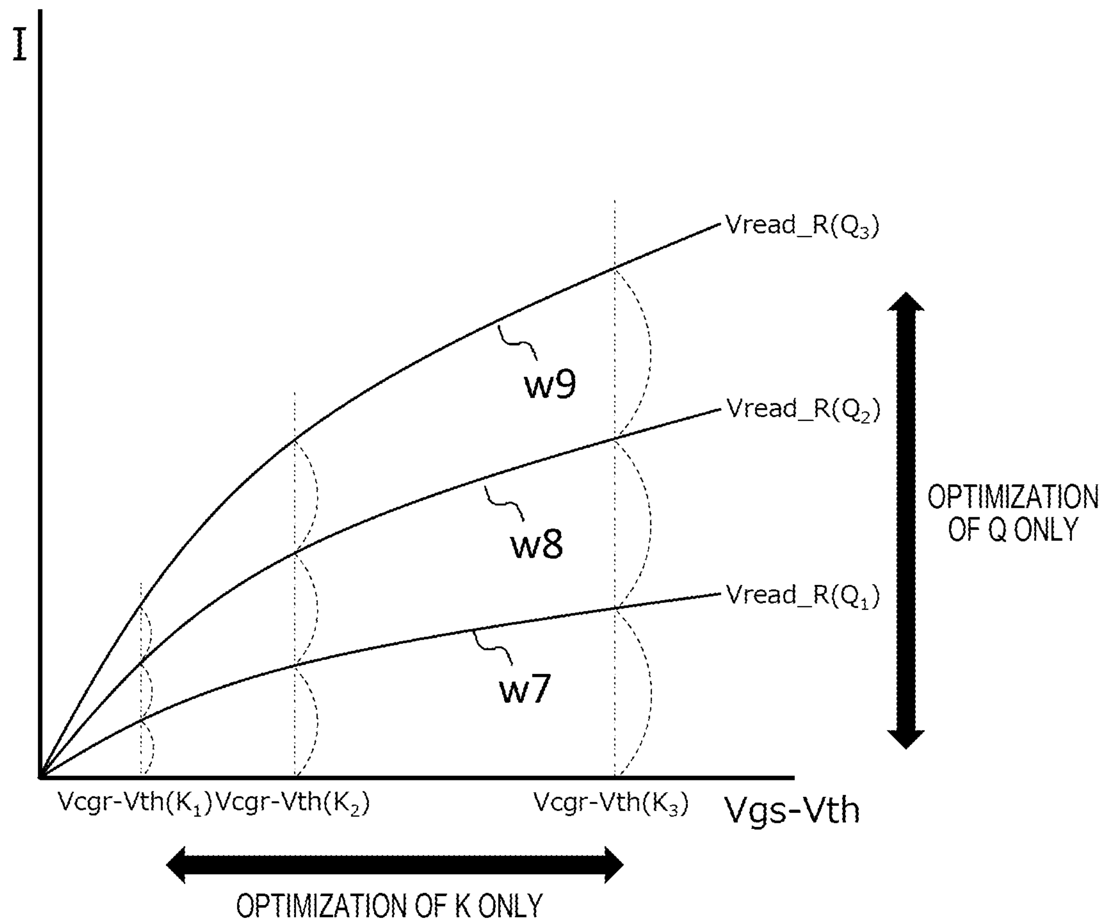
FIG. 11 is a diagram showing a case where the relationship between overdrive voltage and a current flowing through a string is not ideal.

FIG. 11 is a diagram showing a case where the relationship between the overdrive voltage and the current flowing through the string 11 is not ideal. The horizontal axis and the vertical axis of FIG. 11 indicate the same elements as those in FIG. 10. FIG. 11 shows three curves w7 to w9 indicating cases where the voltage corresponding to the second data Q applied to the gates of the transistors 13*a* in the second transistor group 13 of the string 11 is changed in three ways.

The waveforms of the curves w7 to w9 may be changed by adjusting the threshold voltage of each transistor 13*a* in the second transistor group 13. Furthermore, the overdrive voltage may be changed by adjusting the first voltage Vcgr applied to the specific transistor 12*a* in the first transistor group 12. As a result, the plot positions of the overdrive voltage may be set to have a constant interval on the curves w7 to w9 as shown in FIG. 11, and even if the current flowing through the string 11 may fluctuate to some extent, corresponding items of the first data K and the second data Q may be determined.

As described above, in the method for performing a multiply-accumulate operation using the first data K and the second data Q in a semiconductor memory according to the first embodiment, the cascode-connected transistors 12*a*, 12*b*, and 13*a* included in the string 11 is divided into the first transistor group 12 and the second transistor group 13. The first transistor group 12 is disposed to a side that is closer to the bit line BL, and the second transistor group 13 is disposed to a side that is more distant from the bit line BL. A threshold voltage associated with a corresponding item of the first data K is set at each of the transistors 12*a* and 12*b* in the first transistor group 12. The first voltage Vcgr is applies to the gate of any one of the two or more transistors 12*a* (the specific transistor 12*a*) in the first transistor group 12. The remaining one or more transistors 12*b* are set to an ON state.

The threshold voltage of each transistor 13*a* in the second transistor group 13 is set to be the same value, and a voltage associated with a corresponding item of the second data Q is applied to the gate of each transistor 13*a*. As a result, each transistor 13*a* in the second transistor group 13 has a resistance value associated with the corresponding item of the second data Q. Thus, second transistor group 13 acts as a resistance R having a resistance value determined by the corresponding item of the second data Q.

As described above, it is possible to cause a current to flow through the string 11 of the first embodiment after the resistance value of the second transistor group 13 is adjusted, the current corresponding to the overdrive voltage applied to the gate of the specific transistor 12*a* in the first transistor group 12. Thus, the current flowing through the string 11 is proportional to the product of the first data K and the second data Q.

It is desirable that the relationship between the overdrive voltage applied to the gate of the specific transistor 12*a* in the first transistor group 12 and the current flowing through the string 11 be substantially linear. The linearity may be improved by adjusting the threshold voltage of each transistor 13*a* in the second transistor group 13. Furthermore, by adjusting the voltage applied to the gate of the specific transistor 12*a* in the first transistor group 12, the overdrive voltage applied to the first transistor 12*a* may be adjusted. As a result, it is possible to specify the first data K and the second data Q from the current flowing through the bit line BL, or the potential of the bit line BL.

Second Embodiment

An information processing device 10 according to a second embodiment is a more specific form of the information processing device 10 according to the first embodiment described above.

Figure 12:
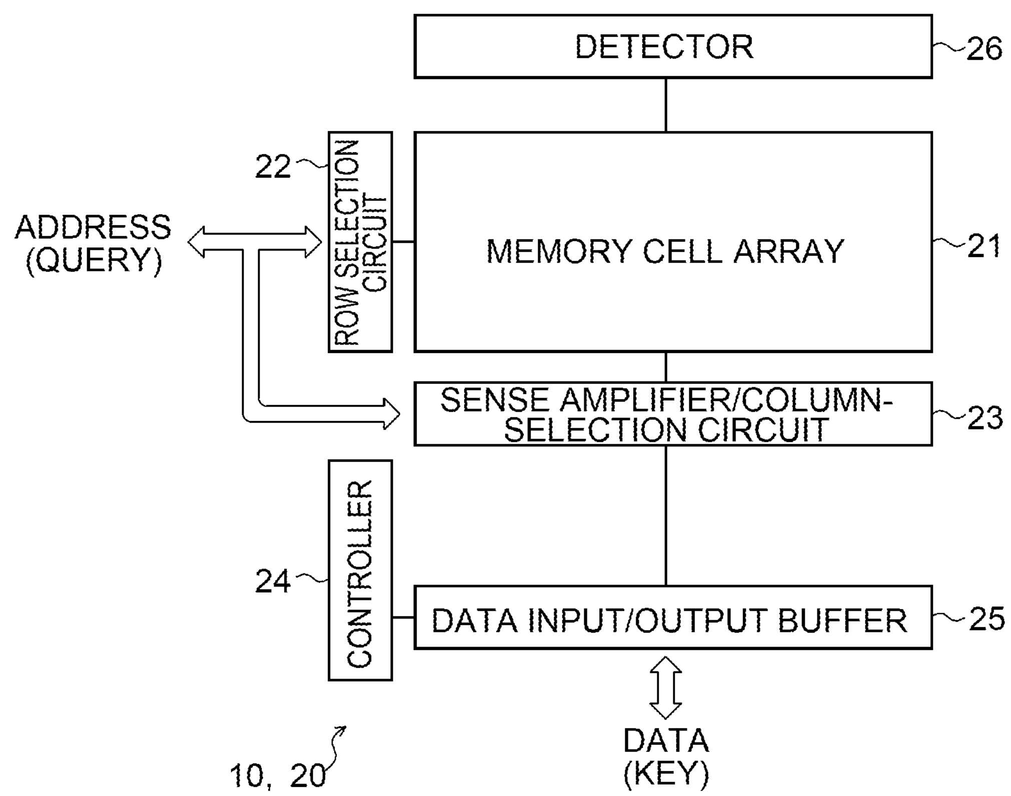
FIG. 12 is a block diagram showing a schematic configuration of a memory system including an information processing device according to a second embodiment.

FIG. 12 is a block diagram showing a schematic configuration of a memory system 20 including the information processing device 10 according to the second embodiment. The memory system 20 shown in FIG. 12 includes a memory cell array 21, a row selection circuit 22, a sense amplifier/column-selection circuit 23, a controller 24, and a data input/output buffer 25. The memory cell array 21 shown in FIG. 12 corresponds to the information processing device 10.

In the memory cell array 21, two or more strings 11 are connected to a single bit line BL, like the case shown in FIG. 7. The memory cell array 21 may include a plurality of bit lines BL. In such a case, every bit line BL includes a plurality of strings 11 as shown in FIG. 7. Each string 11 includes a first transistor group 12 and a second transistor group 13 as shown in FIG. 7. A separate word line WL is connected to the gate of each of the transistors 12*a* and 12*b* in the first transistor group 12 and the gate of each transistor 13*a* in the second transistor group 13.

The row selection circuit 22 drives the word lines WL in response to an instruction from the controller 24. The row selection circuit 22 drives the word lines WL connected to the gates of the transistors 12*a* and 12*b* in the first transistor group 12 of each string 11 so as to set a threshold voltage to each of the transistors 12*a* and 12*b* in the first transistor group 12. Furthermore, the row selection circuit 22 drives the word line WL connected to the gate of each transistor 13*a* in the second transistor group 13 so as to set the same threshold voltage to each transistor 13*a*.

Thereafter, the row selection circuit 22 drives the word line WL connected to the gate of the 12*a*, which is any one of the transistors in the first transistor group 12, and applies a first voltage Vcgr to the gate of this transistor. Furthermore, the row selection circuit 22 drives the word lines WL connected to the gates of the remaining one or more transistors 12*b* and applies a second voltage Vread to the gate of each of the one or more transistors 12*b*, the voltage level of the second voltage Vread being higher than that of the first voltage Vcgr. The row selection circuit 22 also drives the word line WL connected to the gate of each transistor 13*a* in the second transistor group 13 and applies the second voltage Vread to the gate of each transistor 13*a*, the second voltage Vread applied to the gate of each transistor being determined in consideration of the source voltage of each transistor since the source voltage differs among the transistors.

The data input/output buffer 25 obtains a key K from the outside, and supplies the obtained key K to the sense amplifier/column-selection circuit 23 in response to an instruction from the controller 24. The sense amplifier/column-selection circuit 23 supplies the key K outputted from the data input/output buffer 25 to the bit line BL.

The memory cell array 21, the row selection circuit 22, the sense amplifier/column-selection circuit 23, the controller 24, and the data input/output buffer 25 shown in FIG. 12 may be used as the memory system 20.

The information processing device 10 shown in FIG. 12 may include a detector 26. The detector 26 detects at least one of the current flowing through the bit line BL and the voltage of the bit line BL. The detector 26 may output to the outside a digital signal obtained by analog-to-digital conversion of the at least one of the current flowing through the bit line BL and the voltage of the bit line BL.

The information processing device 10 shown in FIG. 12 may be configured to select one of a mode in which the memory cell array 21 is used as an ordinary memory and a mode in which multiply-accumulate operation of the first data K and the second data Q is performed.

The memory cell array 21 may have a memory cell region used as an ordinary memory, and a memory cell region used to perform multiply-accumulate operation of the first data K and the second data Q.

As described above, in the second embodiment, a semiconductor memory having a configuration that is substantially equivalent to the configuration of an ordinary memory is used to perform a processing operation that is substantially the same as the processing operation performed by the information processing device 10 according to the first embodiment. Since the information processing device 10 that performs multiply-accumulate operation may be obtained by partially changing the configuration of an ordinary memory, it is possible to design such an information processing device 10 in a short design time, using an existent semiconductor process.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An information processing device comprising:

a string including a first transistor and a second transistor connected to each other; and a first wiring line connected to an end of the string, the first transistor having a threshold voltage corresponding to a first data, the second transistor having a drain and a source, a resistance value between the drain and the source corresponding to a second data, wherein a current corresponding to a product of the first data and the second data flows through the string.

2. The information processing device according to claim 1, wherein the current corresponding to the product of the first data and the second data flows from the first wiring line to the string.

3. The information processing device according to claim 1, wherein the string includes:

a first transistor group disposed on a first side closer to the first wiring line, in which two or more transistors including the first transistor are connected to each other; and a second transistor group disposed on a second side more distant from the first wiring line than the first side on which the first transistor group is disposed, the second transistor group including one or more transistors including the second transistor.

4. The information processing device according to claim 3, wherein a first voltage is applied to a gate of any one of the two or more transistors in the first transistor group, and a second voltage that is higher than the first voltage is applied to a gate of each of remaining one or more transistors in the first transistor group.

5. The information processing device according to claim 4, wherein the first voltage is higher than a maximum threshold voltage that may be set to the two or more transistors.

6. The information processing device according to claim 4, wherein the remaining one or more transistors in the first transistor group are set to be in an ON state.

7. The information processing device according to claim 4, wherein as a voltage difference between a threshold voltage of the any one of the two or more transistors and the first voltage increases, the current flowing through the first transistor group increases.

8. The information processing device according to claim 4, wherein the current flowing through the first transistor group corresponds to a voltage difference between a threshold voltage of the any one of the two or more transistors, to the gate of which the first voltage is applied, and the first voltage.

9. The information processing device according to claim 4, wherein the first transistor group includes cascode-connected m transistors including the first transistor, where m is an integer of 2 or more, and wherein each of the m transistors has a threshold voltage corresponding to an item of m items of the first data.

10. The information processing device according to claim 9, wherein the first voltage is applied to the gate of the any one of the two or more transistors in the m transistors, and the remaining one or more transistors are set to be in the ON state.

11. The information processing device according to claim 10, wherein the current flowing through the first transistor group corresponds to a voltage difference between a threshold voltage of the any one of the two or more transistors, to the gate of which the first voltage is applied, in the m transistors, and the first voltage.

12. The information processing device according to claim 10, wherein in the m transistors, the any one of the two or more transistors to which the first voltage is applied operates in a sub-threshold region, and the remaining one or more transistors to which the second voltage is applied operate in a saturation region.

13. The information processing device according to claim 10, wherein the second transistor group includes one or more transistors including the second transistor, where n is an integer of 1 or more, and wherein a voltage corresponding to an item of the second data is applied to a gate of each of the transistors.

14. The information processing device according to claim 13, wherein each of the transistors has a resistance value corresponding to a voltage difference between the voltage corresponding to the item of the second data and the threshold voltage.

15. The information processing device according to claim 14, wherein the second transistor group has a resistance value corresponding to a sum of drain-source resistances of the transistors.

16. The information processing device according to claim 13, wherein the voltage corresponding to the item of the second data applied to the gate of each of the transistors is based on a corresponding source voltage.

17. The information processing device according to claim 1, wherein the device comprises a plurality of the strings, an end of each of the strings being connected to the first wiring line, and wherein a current corresponding to a sum of currents flowing through the plurality of strings flows through the first wiring line.

18. The information processing device according to claim 17, wherein each of the strings causes a voltage drop to the first wiring line according to the current flowing through each of the strings.

19. A memory system comprising:

a nonvolatile memory; and a controller configured to control writing and reading of data with respect to the nonvolatile memory, the nonvolatile memory including:

a string including a plurality of transistors connected to each other; and a first wiring line connected to an end of the string, the string including a first transistor group disposed on a first side closer to the first wiring line, the first transistor group including two or more transistors of the plurality of transistors, and a second transistor group disposed on a second side more distant from the first wiring line than the first side on which the first transistor group is disposed, the second transistor group including one or more transistors of the plurality of transistors, a threshold voltage associated with a corresponding item of a first data being set to each transistor in the first transistor group, and a voltage associated with a corresponding item of a second data being applied to a gate of each transistor in the second transistor group, wherein a current flows through the string, the current corresponding to a product of an item of the first data corresponding to a threshold voltage of any one of the two or more transistors in the first transistor group and the corresponding item of the second data applied to the gate of each transistor in the second transistor group.

20. A memory system according to claim 19, further comprising a detector configured to detect the current flowing through the first wiring line or a voltage of the first wiring line, wherein the current corresponding to the product of the item of the first data and the corresponding item of the second data flows from the first wiring line to the string.

* * * * *